United States Patent
Frazier et al.

(10) Patent No.: US 11,677,040 B2
(45) Date of Patent: Jun. 13, 2023

(54) METHOD AND APPARATUS FOR ENHANCED PHOTOCONDUCTIVITY OF SEMICONDUCTOR

(71) Applicant: Raytheon Company, Waltham, MA (US)

(72) Inventors: Gary A. Frazier, Garland, TX (US); Kyle L. Grosse, Elk Grove Village, IL (US)

(73) Assignee: Raytheon Company, Waltham, MA (US)

( * ) Notice: Subject to any disclaimer, the term of this patent is extended or adjusted under 35 U.S.C. 154(b) by 559 days.

(21) Appl. No.: 16/690,181

(22) Filed: Nov. 21, 2019

(65) Prior Publication Data

US 2021/0159357 A1    May 27, 2021

(51) Int. Cl.

| | |
|---|---|
| *H01L 31/09* | (2006.01) |
| *H01L 31/0216* | (2014.01) |
| *H01L 31/0224* | (2006.01) |
| *H01L 31/028* | (2006.01) |
| *H01L 31/14* | (2006.01) |
| *H01L 31/18* | (2006.01) |

(52) U.S. Cl.
CPC ............ *H01L 31/09* (2013.01); *H01L 31/028* (2013.01); *H01L 31/0216* (2013.01); *H01L 31/022475* (2013.01); *H01L 31/143* (2013.01); *H01L 31/1804* (2013.01); *H01L 31/1884* (2013.01)

(58) Field of Classification Search
CPC .......... H01L 31/09; H01L 31/0216; H01L 31/022475; H01L 31/028; H01L 31/143; H01L 31/1804; H01L 31/1884; H01Q 15/002

See application file for complete search history.

(56) References Cited

U.S. PATENT DOCUMENTS

| | | | | |
|---|---|---|---|---|
| 3,529,161 A | * | 9/1970 | Oosthoek et al. | ...... H01L 21/00 257/E31.089 |
| 4,904,039 A | * | 2/1990 | Soref | ...................... G02F 1/025 385/2 |
| 4,922,253 A | | 5/1990 | Nathanson | |
| 5,014,069 A | | 5/1991 | Seiler | |
| 5,360,973 A | | 11/1994 | Webb | |
| 5,625,729 A | * | 4/1997 | Brown | .................... G02F 1/025 385/12 |
| 6,177,674 B1 | * | 1/2001 | Rutt | ....................... G02F 1/015 250/351 |

(Continued)

FOREIGN PATENT DOCUMENTS

| | | |
|---|---|---|
| KR | 101270197 B1 | 5/2013 |
| WO | 2007138583 A1 | 12/2007 |

OTHER PUBLICATIONS

International Search Report and Written Opinion for corresponding International Application No. PCT/US2020/045115 dated Nov. 13, 2020.

*Primary Examiner* — Seung C Sohn
(74) *Attorney, Agent, or Firm* — Renner, Otto, Boisselle & Sklar, LLP (57) ABSTRACT

A photoconductor assembly includes a substrate formed of an undoped and single-crystal semiconductor material that is configured to absorb electromagnetic energy, a plurality of electrodes arranged normal to the substrate, and a power supply that applies a voltage to the electrodes for modulating the electromagnetic energy through the substrate.

23 Claims, 5 Drawing Sheets

(56) References Cited

U.S. PATENT DOCUMENTS

| | | | | |
|---|---|---|---|---|
| 6,313,803 | B1* | 11/2001 | Manasson | H01Q 3/46 |
| | | | | 343/756 |
| 6,806,114 | B1* | 10/2004 | Lo | H01S 5/18361 |
| | | | | 438/36 |
| 8,798,112 | B2* | 8/2014 | Chitica | H01S 5/18327 |
| | | | | 372/45.01 |
| 9,595,623 | B1* | 3/2017 | Xie | H01L 31/022466 |
| 2002/0164107 | A1* | 11/2002 | Boudreau | G02B 6/4257 |
| | | | | 385/14 |
| 2002/0185590 | A1* | 12/2002 | Yahav | H01L 31/125 |
| | | | | 250/214.1 |
| 2016/0197215 | A1 | 7/2016 | Kozyrev | |
| 2018/0219628 | A1* | 8/2018 | Makurin | H04B 10/40 |
| 2019/0006730 | A1* | 1/2019 | Allen | H01P 7/088 |

\* cited by examiner

METHOD AND APPARATUS FOR ENHANCED PHOTOCONDUCTIVITY OF SEMICONDUCTOR

FIELD OF THE INVENTION

The invention relates to devices and methods that use photoconductive semiconductor materials for generating electrical conductivity.

DESCRIPTION OF THE RELATED ART

Various applications use solid-state photoconductive semiconductors, such as electronic devices including display devices. A semiconductor material has an electronic band structure that is determined by the crystal properties of the material. The material has an energy gap between conduction and valence bands. When a semiconductor material is illuminated by a light source, such as a laser, electrons in the material are able to absorb energy enabling them to transition from the valence band to the conduction band. The transitioned electrons leave behind a vacant state in the valence band called a hole, such that electron-hole pairs are generated. The free electrons and holes enable current to flow in the semiconductor when an external voltage is applied such that electrical conductivity is increased across the semiconductor material. The electrons may naturally recombine with vacant states in which the electrons transition from the conduction band to the valence band. During recombination, the energy absorbed by the semiconductor material is released in the form of photons or phonons or both photons and phonons.

Conventional semiconductor materials for photoconductors include amorphous films such as silicon or cadmium sulfide. Illumination of these materials produce a certain average number of mobile charges which can participate in electrical conduction or serve to reflect or absorb electromagnetic waves. A material with mobile charges can reflect or absorb radio frequency waves. Therefore, a photoconductor may be used to either reflect or absorb radio-frequency (RF) energy when illuminated by light or allow the passage of RF energy through the material when un-illuminated. However, using the conventional photoconductive materials are disadvantageous in that the materials have defects that cause recombination to occur quickly which reduces the number of free electrons available to absorb or reflect RF energy. The free electrons and holes are in proximity in traditional photoconductor devices which facilitates rapid recombination and lowering of the average number of free charges available for use as RF reflectors or absorbers. Such materials when produced in amorphous form may also have poor carrier mobility which negatively impacts the conductivity and thus limits the usefulness of such devices for reflecting or absorbing a desired amount of RF energy as required in a particular application. Thus, an electronic device implementing traditional photoconductors in traditional configurations may have a lower efficiency than is desirable.

SUMMARY OF THE INVENTION

A photoconductive semiconductor according to the present application includes a substrate or wafer that is formed of an undoped and single-crystal semiconductor material that is free of impurities for reflecting or absorbing electromagnetic energy, such as radio-frequency (RF) energy in the substrate. The photoconductor also includes a plurality of electrodes that are disposed onto the substrate and a power supply for applying a voltage to the electrodes. Using the electrodes is advantageous in enabling the electron-hole pairs formed by illumination of the substrate to be pulled apart to different locations within the substrate, such that the lifetime for the electron-hole pairs is increased, i.e. the recombination rate is decreased and the free carrier lifetime is increased. The power supply is advantageously configured as an electrical bias that modulates the fraction of incident electromagnetic energy that is reflected by or absorbed by the substrate. Accordingly, the substrate acts as an electrical capacitor and provides a photoconductor having a selective or programmable level of electrical conductivity and response to incident electromagnetic energy such as radio waves.

The electrodes may be formed of a conducting film with a high resistivity that supports the generation of the electric field between the electrodes but does not hinder RF energy from passing through. Uniform coating of the electrodes on the substrate surface may be suitable or the electrodes may be patterned for geometric transmission and blockage. The light supplied by the light source may also be patterned in exemplary embodiments. The voltage applied to the electrodes and/or the intensity of the light may be modulated to further control the rate of electron-hole pair generation and recombination. Based on a depth of absorption of the semiconductor material, the light source is configured to provide photons having wavelengths that are equal to or slightly shorter than the wavelength corresponding to the bandgap of the semiconductor material to control the amount of light that is absorbed and the depth to which the light penetrates into the substrate before absorption occurs.

According to an aspect of the invention, a photoconductor assembly uses an undoped and single-crystal semiconductor material.

According to an aspect of the invention, a photoconductor assembly includes an electrical bias.

According to an aspect of the invention, a photoconductor assembly includes a plurality of electrodes that are arranged normal to a substrate formed of a semiconductor material.

According to an aspect of the invention, an electrical device includes a photoconductor assembly having a substrate or wafer formed of an undoped and single-crystal semiconductor material.

According to an aspect of the invention, an electrical device includes a photoconductor assembly having an electrical bias.

According to an aspect of the invention, an electrical device includes a photoconductor assembly having a plurality of electrodes that are arranged normal to a substrate formed of a semiconductor material.

According to an aspect of the invention, a photoconductor assembly includes a substrate formed of an undoped and single-crystal semiconductor material that is configured to reflect or absorb electromagnetic energy, a plurality of electrodes arranged normal to the substrate, and a power supply that applies a voltage to the electrodes for modulating the electromagnetic energy through the substrate.

According to an embodiment of any paragraph(s) of this summary, the semiconductor material has a resistivity that is greater than 5000 ohms-cm.

According to an embodiment of any paragraph(s) of this summary, the semiconductor material is float-zone silicon or germanium.

According to an embodiment of any paragraph(s) of this summary, the photoconductor assembly includes an insulating layer formed on at least one of two opposing faces of the substrate.

According to an embodiment of any paragraph(s) of this summary, the electrodes are formed of a transparent conductive film.

According to an embodiment of any paragraph(s) of this summary, the transparent conductive film includes indium tin oxide.

According to an embodiment of any paragraph(s) of this summary, the plurality of electrodes are arranged on opposing sides of the substrate.

According to an embodiment of any paragraph(s) of this summary, the substrate is formed as a disc-shaped wafer.

According to an embodiment of any paragraph(s) of this summary, the electrodes are uniformly coated on opposing surfaces of the substrate.

According to an embodiment of any paragraph(s) of this summary, the electrodes are patterned on the substrate.

According to an embodiment of any paragraph(s) of this summary, the electrodes are arranged in a pattern that includes at least one of striped or checkered.

According to an embodiment of any paragraph(s) of this summary, the power supply is configured to apply a modulated voltage.

According to an embodiment of any paragraph(s) of this summary, the photoconductor assembly includes a light source that generates excitation wavelengths for illuminating the substrate having energies that are equal to or greater than a band gap energy of the semiconductor material.

According to an embodiment of any paragraph(s) of this summary, the wavelengths have a length in a range that is between zero and ten percent shorter than a wavelength corresponding to the band gap energy of the semiconductor material.

According to another aspect of the invention, an electronic device includes an electromagnetic energy transmitter, a wafer that is formed of an undoped and single-crystal semiconductor material that reflects or absorbs electromagnetic energy from the electromagnetic energy transmitter, a light source that generates excitation wavelengths for illuminating the wafer having energies that are greater than a band gap of the semiconductor material, a plurality of electrodes arranged normal to the wafer, and a power supply that applies a voltage to the electrodes for modulating the electromagnetic energy through the substrate.

According to an embodiment of any paragraph(s) of this summary, the power supply is configured to apply a modulated voltage and/or the light source includes a pulsed light source or an analog intensity modulator.

According to an embodiment of any paragraph(s) of this summary, the semiconductor material is a float-zone silicon or germanium.

According to an embodiment of any paragraph(s) of this summary, the wavelengths have a length in a range that is between zero and ten percent shorter than a wavelength corresponding to the band gap energy of the semiconductor material.

According to an embodiment of any paragraph(s) of this summary, the electrodes are uniformly coated on opposing sides of the wafer or patterned on at least one of the opposing sides of the wafer.

According to still another aspect of the invention, a method of generating electrical conductivity for a photoconductor includes forming a wafer of an undoped and single-crystal semiconductor material for absorbing electromagnetic energy, arranging a plurality of electrodes normal to the wafer, determining a depth of absorption for the wafer, transmitting electromagnetic energy to the wafer, illuminating the wafer based on the depth of absorption using a light source that generates excitation wavelengths having energies that are greater than a band gap of the semiconductor material, and applying a voltage between the electrodes to modulate the electromagnetic energy through the wafer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings, which are not necessarily to scale, show various aspects of the invention.

DETAILED DESCRIPTION

The principles described herein may be used in applications that use photoconductive semiconductor materials.

Exemplary applications include electronic devices such as mobile phones or other display devices. Other electronics applications may also be suitable. For example, a radome of a radio-frequency (RF) transmitting system may implement a curved semiconductor having the features described herein. RF applications are suitable, but other electromagnetic energy applications may also be suitable, such as optical applications. Optical or infrared modulators may be suitable applications. Many other applications may be suitable.

Figure 1A:
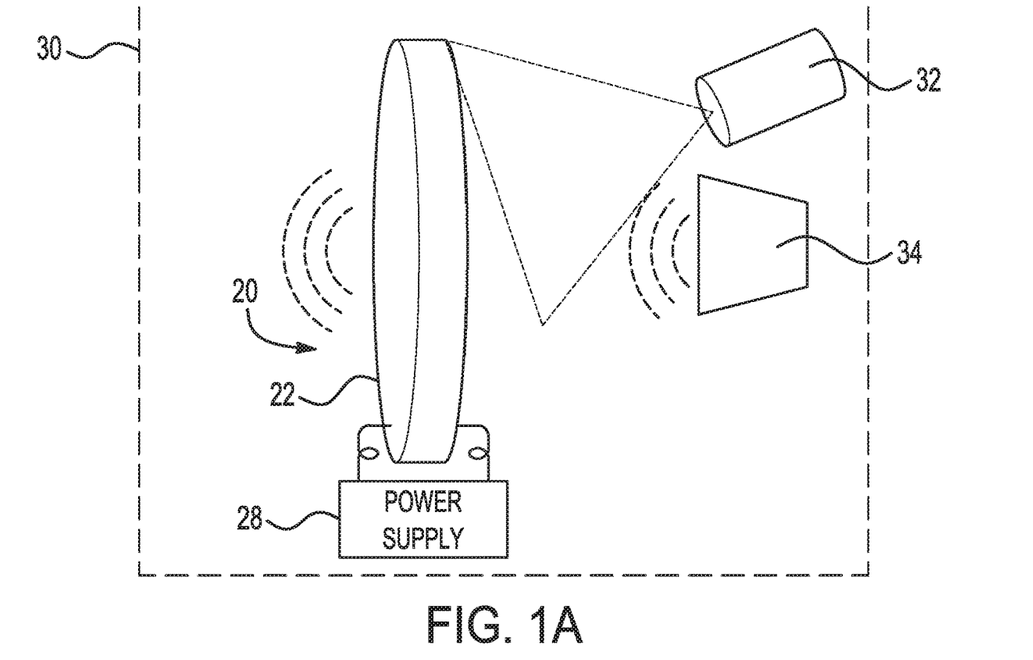
FIG. 1A shows a photoconductor assembly according to an embodiment of the present application.
Figure 1B:
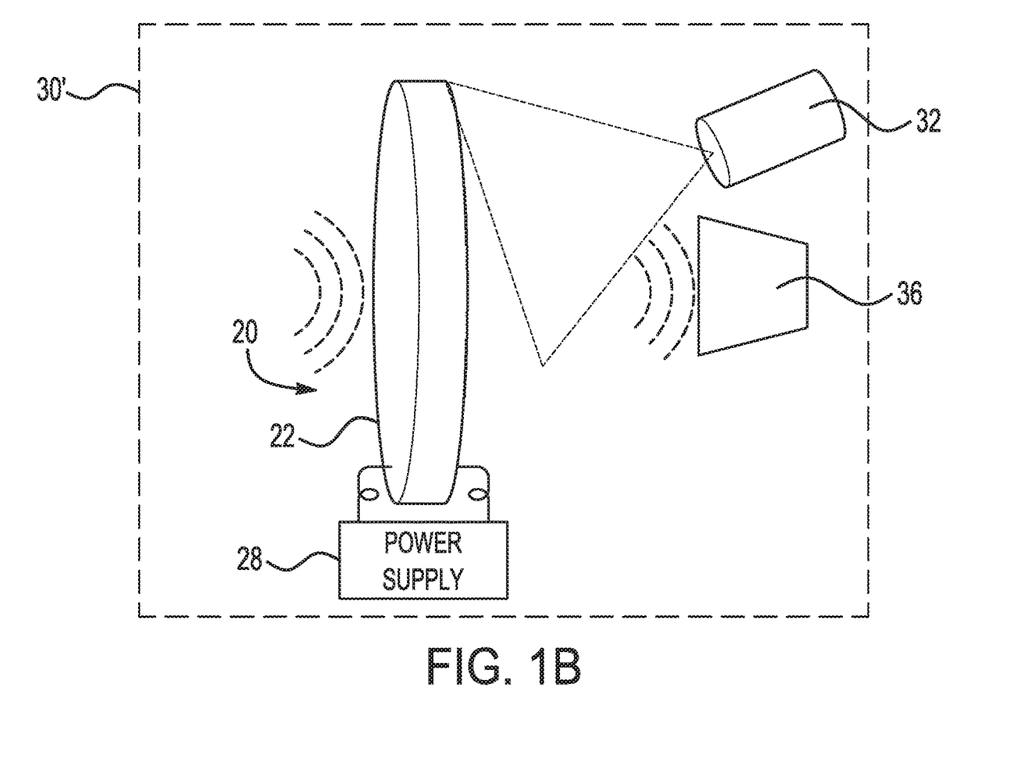
FIG. 1B shows a photoconductor assembly according to another embodiment of the present application.
Figure 2:
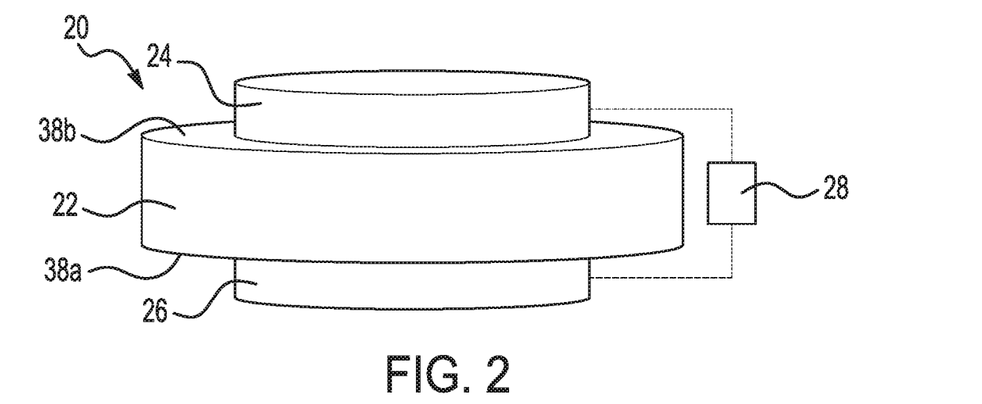
FIG. 2 shows a substrate of the photoconductor assembly of FIG. 1A having electrodes according to an embodiment of the present application.

Referring first to FIGS. 1A-2, schematic drawings of a photoconductor assembly 20 are shown. The photoconductor assembly 20 includes a substrate 22 that is formed of a semiconductor material having at least one contact or electrode 24, 26 arranged on the substrate 22, as shown in FIG. 2, and a power supply 28 for generating a voltage between the electrodes 24, 26. The substrate 22 is formed to absorb or reflect electromagnetic energy when the substrate 22 is illuminated to generate power. In an exemplary application, the electromagnetic energy includes microwaves or RF waves, but the principles described herein may be suitable for other electromagnetic energy applications. The substrate 22 effectively acts as a shutter or a switch for the RF energy and the semiconductor material is selected to have a predetermined energy gap, which is also referred to as the bandgap or the difference between the top of a valence band and a bottom of a conduction band in the material.

The substrate 22 may also be referred to as a wafer and has a disc shape in exemplary embodiments. A thickness of the substrate 22 is less than the diameter. For example, the substrate 22 may have a thickness that is between 100 and 500 micrometers. The shape and size of the substrate 22 is dependent on the application and many sizes and shapes may be suitable. For example, the substrate 22 may be rectangular. In an embodiment in which the substrate 22 is cylindrical, the substrate 22 may have a diameter that is between 7 centimeters (3 inches) and 25 centimeters (10 inches). In an exemplary application in which the substrate 22 is used in a radome of an RF transmitting system, the substrate 22 may be curved. The equivalent of a curved substrate 22 may be approximated by an array of smaller substrates arranged with flexible joining members to create a tessellation of tiles that approximate the curvature of a single substrate.

The semiconductor material of the substrate 22 is any suitable semiconductor material that has a minimal number of extraneous defects or is without extraneous defects or impurities, as compared with conventional structures using amorphous materials having defects or dopants that disadvantageously create new energy states within the energy gap of the material. Semiconductor materials having undoped and pure single-crystal structures are suitable. Float-zone materials that are formed of a vertical zone melting process to generate a pure material may be suitable. In exemplary embodiments, float-zone silicon or germanium may be used. Any other manufacturing processes for forming a semiconductor material that is free of impurities, i.e. to form a material having a "perfect crystal" structure, may also be suitable. Additionally, the semiconductor material has a high resistivity in contrast to conventional intrinsic undoped semiconductors. In an exemplary embodiment, a suitable material may have an electrical resistivity that is greater than 5000 ohm-cm. In exemplary applications, the resistivity may be greater than ten times higher than 5000 ohm-cm.

As schematically shown in FIG. 1A, the photoconductor assembly 20 may be arranged in an electronic device 30 and further include a light source 32 for illuminating the substrate 22 and an electromagnetic energy transmitter 34, such as a microwave or RF transmitter for transmitting microwave or RF energy to the substrate 22. The electronic device 30 may include a flat or curved display device. Any suitable light source 32 may be used and the light source 32 may include light-emitting diodes (LEDs), lasers, or other light sources. The light source 32 is configured to generate excitation wavelengths having energies that are greater than the bandgap of the selected semiconductor material such that the substrate 22 absorbs a desired amount of light instead of passing light all the way through the substrate 22 or propagating light such that the light would not be absorbed. The absorption depth for the semiconductor material corresponds to the substrate 22 dimensions and material.

FIG. 1B shows an alternative embodiment of the electronic device 30' in which the RF energy source may be located at a distant location and serve as a transmitter of RF energy directed toward the substrate 22. The RF source 34 of the electronic device 30 shown in FIG. 1A may be replaced by a RF radio receiver 36 that is configured to receive RF energy at the frequency of the remote transmitter. The operation of the electronic device 30' operates in the same manner where the power supply 28 and illumination source 32 serve to modulate the amount of RF energy from the remote source that reaches the receiver.

In an exemplary embodiment in which the semiconductor material is float-zone single-crystal silicon, the light source 32 may be configured to provide between 1 and 20 watt/cm$^2$ of peak optical illumination with photons having 0.905 micrometers of wavelength. Silicon is transparent to infrared light having wavelengths above roughly 1.1 micrometers such that the light source 32 is configured to emit photons having wavelengths that are slightly shorter than the bandgap of the silicon. The wavelengths emitted by the light source 32 for a particular semiconductor material used in the substrate 22 may be in a range that is between 0% and 10% shorter than the wavelength corresponding to the band gap energy for the semiconductor material. The specific illuminator wavelength is selected so that the photon penetrates roughly halfway through the semiconductor substrate before being absorbed. This ensures that the electron hole pairs are created well away from the surface of the substrate where surface recombination rates are the highest.

When the substrate 22 is illuminated, the electrons will absorb electromagnetic energy. When the light is absorbed in the semiconductor material, the number of free electrons and electron holes, i.e. carriers, increases. Blockage of the RF energy is dependent on the number of electrons per unit volume of the material. The electrons will typically quickly recombine with the vacant states (the holes) in their vicinity. Applying electric bias to the electrodes 24, 26 forces separation between the vacant states (the holes) and the electrons to reduce the recombination rate. Field strengths of 1000 volts/cm may be sufficient to reduce the electron-hole recombination rate in Silicon at room temperature by 10 times.

The electrodes 24, 26 are arranged normal to the conducting path across the semiconductor material of the substrate 22 for providing physical separation between the electrons and the holes. The electron-hole pairs formed by the illumination of the substrate 22 are pulled apart in a direction that is in the direction of the electric field generated by the electrodes 24, 26. Using the electrodes 24, 26 enables the generated electrons and the holes to encounter each other less often than in a conventional photoconductor structure. Advantageously, using the electrodes increases the carrier lifetime and consequently provides a photoconductor having greater electrical conductivity and greater sensitivity to the light provided by the light source 32.

Still a further advantage of the photoconductor assembly 20 is using the power supply 28 to electrically bias the substrate 22 and reduce the recombination rate of the carriers by increasing the RF modulation. A voltage is applied to a first electrode 24 and an oppositely positioned electrode 26 that is arranged on an opposing side of the substrate 22. The power supply 28 is electrically connected between the electrodes 24, 26 and may be configured to supply any suitable voltage. In an exemplary application, the voltage may be between 500 and 3500 volts. The voltage may be approximately 2000 volts for a substrate that is approximately 0.05 centimeters (0.020 inches) in thickness. The voltage is applied between opposing faces 38a, 38b of the substrate 22. An electric field is consequently generated in the substrate 22 such that the carriers will move in the electric field. The electrodes 24, 26 will include a positive charge and a negative charge such that the electric field will point in one direction from the positive electrode 24, 26 to the negative electrode 24, 26. The oppositely charged electrodes enable separation of the oppositely charged carriers in the material.

Advantageously, the generated electron and electron holes will have a physical separation that will reduce the natural recombination rate of the generated electron-hole pairs. The electrons and the holes will eventually recombine, but the recombination is suppressed by the physical separation. Thus, the overall lifetime for the electrons and electron holes will advantageously be increased since they must be in physical proximity to recombine. The overall efficiency of the photoconductor assembly 20 may be improved by between 1000% (10 times improvement) when using the electric field as compared with a conventional photoconductor structure which does not include the generated electric field between the electrodes. Using the photoconductor assembly described herein, the substrate 22 acts as a capacitor.

Figure 3:
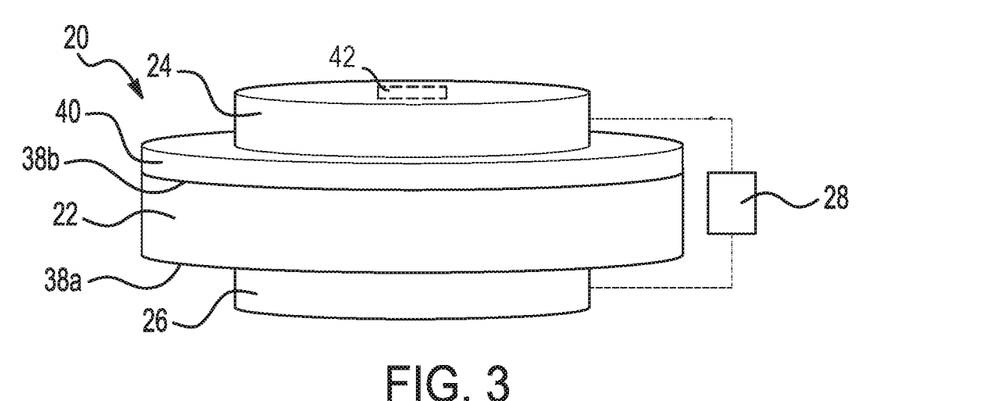
FIG. 3 shows a substrate of the photoconductor assembly of FIG. 1A having electrodes according to another embodiment of the present application.

Referring now to FIG. 3, in an exemplary embodiment in which the semiconductor material of the substrate 22 is a silicon material, the substrate 22 may include an insulating layer 40 that is arranged between at least one of the electrodes 24, 26 and the substrate 22 to prevent electrical conduction during application of the voltage to the electrodes 24, 26. The insulating layer 40 may be deposited on at least one of the faces 38a, 38b of the semiconductor material and is transparent to the RF energy. One of the faces 38a, 38b or both faces 38a, 38b may include an insulating layer 40. The insulating layer 40 may be formed of any suitable material such as silicon dioxide, silicon nitride, or any material that is optically transparent to the illuminator wavelength and which has a breakdown voltage sufficient to prevent electrical breakdown of the insulator when bias is applied to the electrodes 24 and 26.

Referring in addition to FIGS. 4-8, the contacts or electrodes 24, 26 may have different arrangements or patterns and may be formed of any suitable material to control the electrical conductivity generated by the photoconductor assembly. The electrodes 24, 26 may be formed of a transparent conductive film having a predetermined resistivity such that the electrodes 24, 26 enable generation of the electric field but do not prevent electromagnetic energy from passing through. The electrodes may be formed of an indium tin oxide film or any other suitable transparent conducting oxide. In other embodiments, the electrodes may be formed of any suitable RF-transparent polymer material. The polymer material may be applied to the electrode using any suitable method, such as spraying or other deposition methods. In these embodiments, the electrodes may be optically transparent to the illuminator wavelength so that electron-hole pairs are easily generated under and aligned with the electrode pattern.

The arrangement or pattern of the electrodes 24, 26 is dependent on the application. For example, the electrodes 24, 26 may be patterned for a display device application. In other applications, the electrodes 24, 26 may be uniformly coated on at least one of the faces 38a, 38b of the substrate 22, or both faces 38a, 38b. In applications in which the electrodes 24, 26 are patterned, the geometric pattern may be selected for a specific transmission and blockage of RF energy. The pattern may include grid patterns or other geometric patterns for geometrically controlling the energy. The pattern may be ordered or disordered and the faces 38a, 38b of the substrate 22 may have the same pattern or different patterns that correlate to each other to produce a desired output. The pattern may be scaled in geometry to provide a programmable diffraction grating for the expected RF frequencies that are to be modulated or shuttered by the device. For example, a grid pattern of electrodes with electrode pitches between ½ and 2 wavelengths of the incident RF wavelength(s) will produce strong diffraction grating effects when the RF wave passes through the substrate. These grating effects may be used to programmably steer the RF energy that passes through the device into other directions than the original direction of the RF energy.

Figure 4:
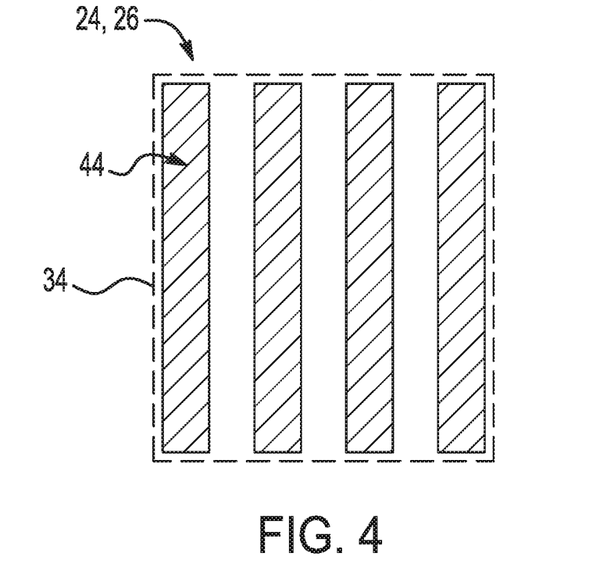
FIG. 4 shows a pattern of the electrodes of FIG. 3 according to an embodiment of the present application in which the electrodes are arranged in stripes.
Figure 5:
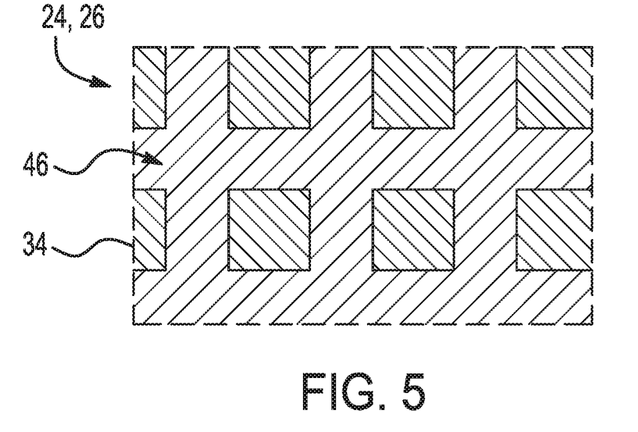
FIG. 5 shows a pattern of the electrodes of FIG. 3 according to another embodiment of the present application in which the electrodes are arranged in squares or a grid.
Figure 6:
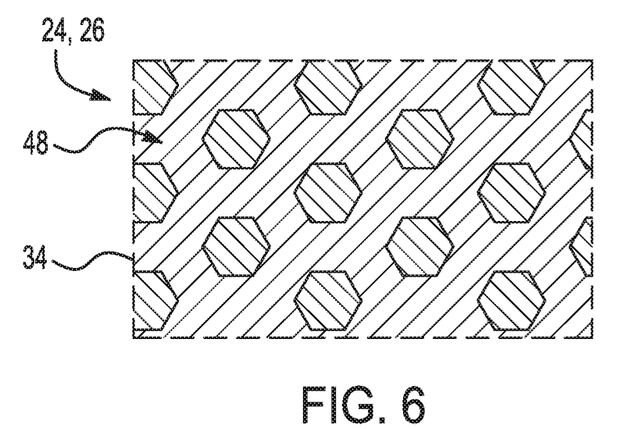
FIG. 6 shows a pattern of the electrodes of FIG. 3 according to still another embodiment of the present application in which the electrodes are arranged in a honeycomb shape.
Figure 7:
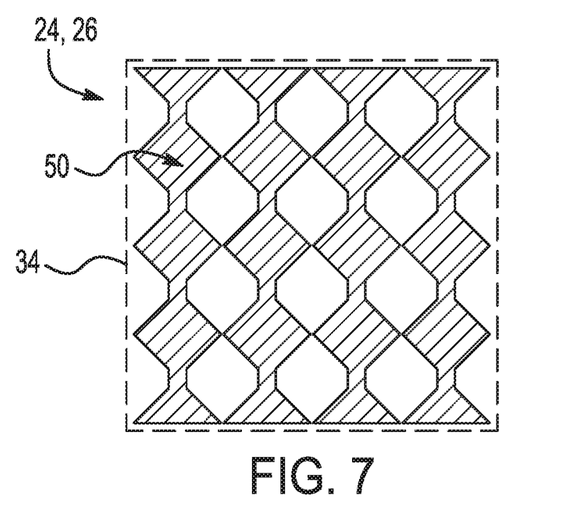
FIG. 7 shows a pattern of the electrodes of FIG. 3 according to still another embodiment of the present application in which the electrodes have a diamond shape.
Figure 8:
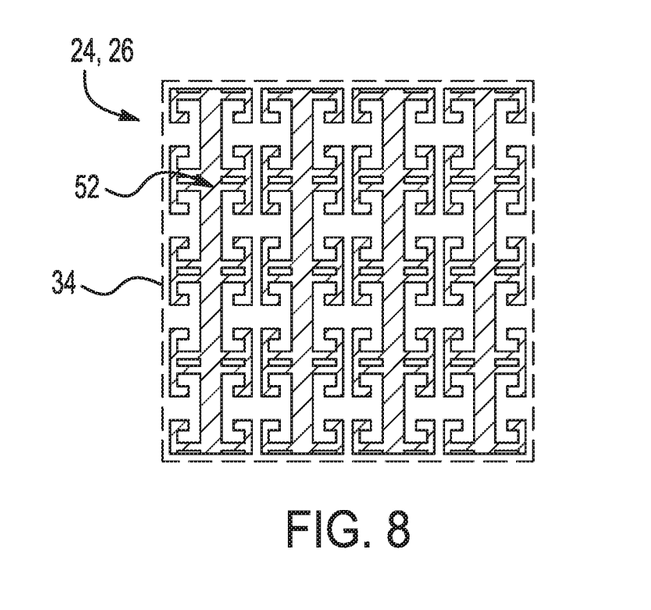
FIG. 8 shows a pattern of the electrodes of FIG. 3 according to still another embodiment of the present application in which the electrodes have a non-uniform geometric pattern.

FIGS. 4-8 show exemplary electrode patterns for the electrodes 24, 26 as shown in an area 42 of the electrode 24 of FIG. 3. FIG. 4 shows a striped pattern 44, FIG. 5 shows a square pattern 46, FIG. 6 shows a honeycomb pattern 48, FIG. 7 shows a diamond pattern 50, and FIG. 8 shows an exemplary geometric pattern 52. Many other patterns are suitable. The electrodes 24, 26 may have opposite patterns in which the patterns may overlay with each other. For example, in an exemplary embodiment, the electrode 24 may have a striped pattern that is vertical and the electrode 26 may have a striped pattern that is horizontal, such that the intersection point between the stripes provides a stronger electric field. In other exemplary embodiments, the pattern may include other grid-type patterns formed of thin wires.

Figure 9:
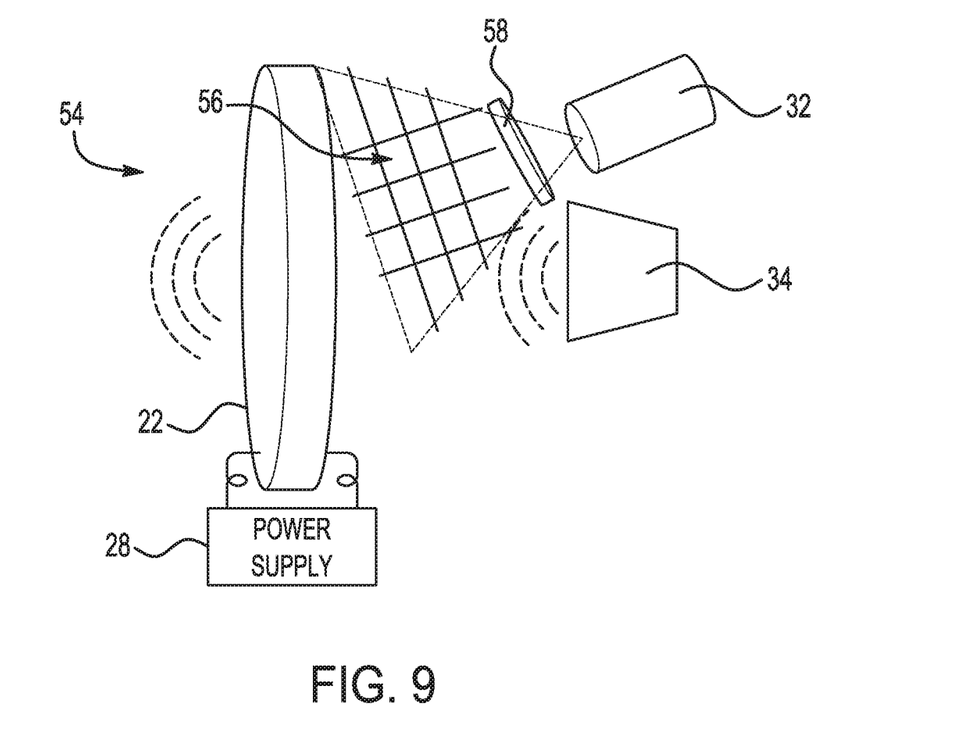
FIG. 9 shows a photoconductor assembly according to another embodiment of the present application in which light being emitted by a light source is patterned.

Referring now to FIG. 9, another embodiment of a photoconductor assembly 54 is shown in which the light is patterned. The photoconductor assembly 54 includes the substrate 22 including the semiconductor material and the electrodes arranged normal to the semiconductor material, the RF transmitter 34, and the light source 32. Instead of patterning the electrodes, or in addition to patterning the electrodes, the light 56 being emitted from the light source 32 is patterned to cause a patterned illumination. The light 56 may be patterned at the light source 32 itself or in other embodiments, a separate mask or shield 58 may be arranged in the light path between the light source 32 and the substrate 22. The light source 32 may be a laser and the beam of the laser may be interrupted or turned on and off to control the pattern of the light 56. For example, the laser may include a diffraction grating.

Figures 10, 11:
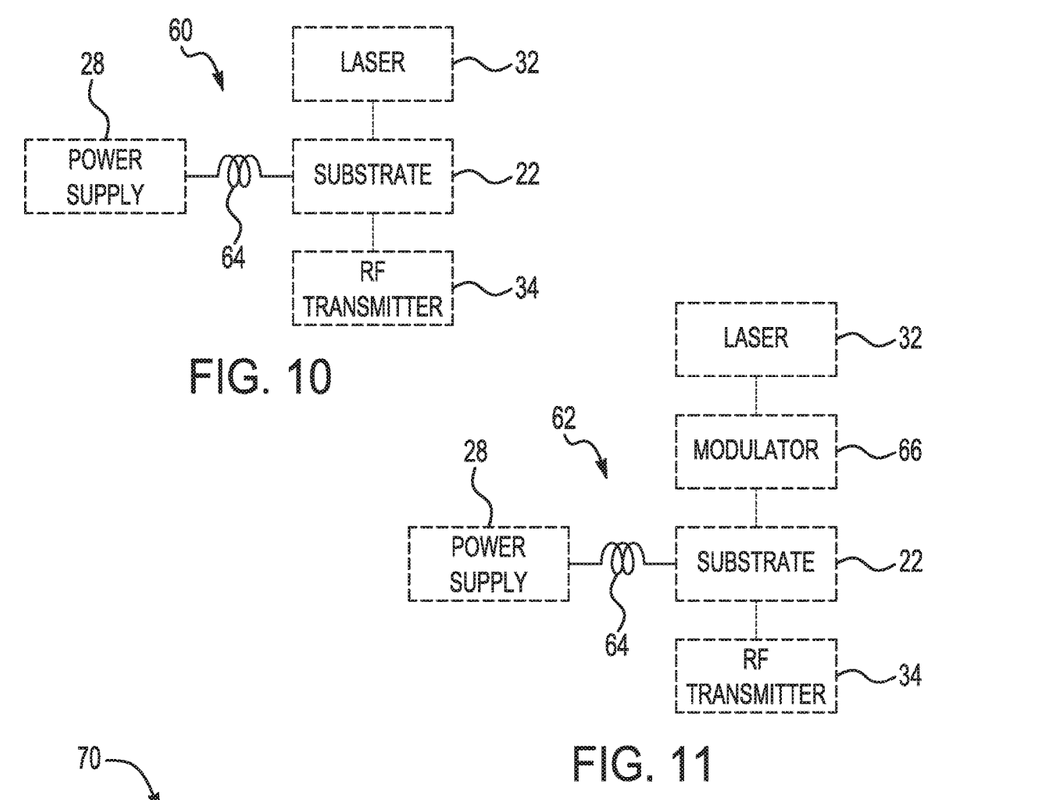
FIG. 10 shows a photoconductor assembly according to still another embodiment of the present application in which a voltage applied to electrodes of the substrate is modulated.
FIG. 11 shows a photoconductor assembly according to still another embodiment of the present application in which a voltage applied to electrodes of the substrate is modulated and light being emitted by a light source is modulated.

Referring now to FIGS. 10 and 11, still other embodiments of the photoconductor assembly 60, 62 are schematically shown. The embodiments shown in FIGS. 10 and 11 use modulation to impact the electrical conductivity in the photoconductor by controlling the efficiency of generating electron hole pairs and recombination. As shown in the photoconductor assembly 60 of FIG. 10, the voltage 64 from the power supply 28 may be modulated to the electrodes of the substrate 22. The power supply 28 may be configured to supply an AC voltage to cause a sinusoidal modulation through the substrate 22 such that the power supply 28 effectively creates an analogue modulator.

As shown in the photoconductor assembly 62 of FIG. 11, the intensity of light from the light source 32, or laser, is modulated. The light intensity may be modulated using any suitable method. The light source 32 may be pulsed or a separate device may be arranged between the light source 32 and the substrate 22 for modulating the light. For example, a modulator 66 may be provided. The modulator 66 may be an analogue modulator. As further shown in the photoconductor assembly 62 of FIG. 11, both the light intensity from the light source 32 and the voltage from the power supply 28 may be modulated to generate a non-linear impact. The modulation in the photoconductor assembly 62 will be a product of the voltage modulation and the light intensity modulation. The modulation may include pulsing in a range that is between 10 and 20 microseconds to modulate the RF at high speeds.

Figure 12:
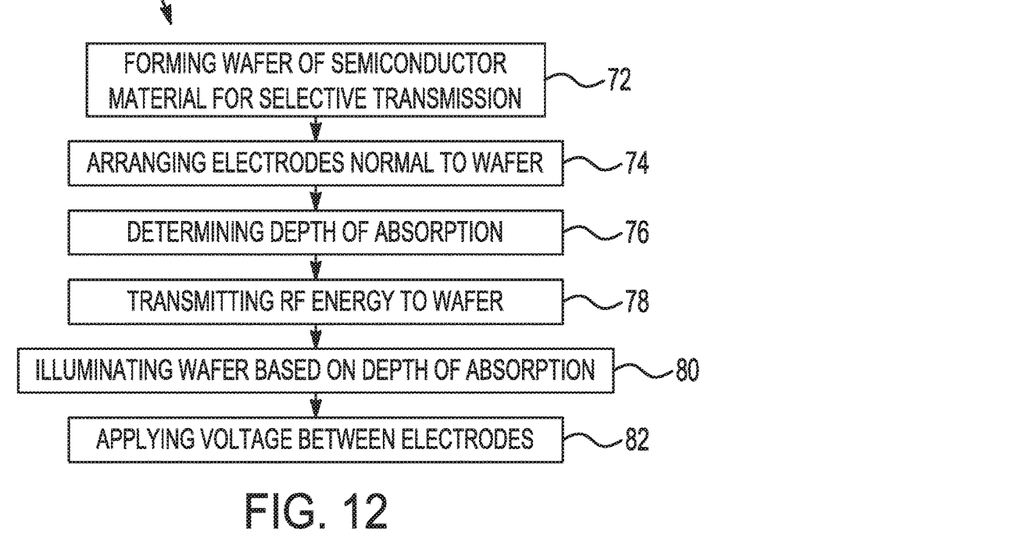
FIG. 12 shows a flowchart for a method of generating electrical conductivity for a photoconductor.

Referring now to FIG. 12, a method 70 of generating electrical conductivity for a photoconductor assembly 20, 54, 60, 62, as shown in FIGS. 1A-11, is shown in a flowchart. Step 72 of the method 70 includes forming the wafer or substrate 22 of the semiconductor material for absorbing the energy in the substrate 22 to generate power (as shown in FIG. 1A). The semiconductor material is a pure single-crystal silicon or germanium material that is undoped and has a minimal number or is free of impurities as compared with conventional materials. Step 74 of the method 70 includes arranging the plurality of electrodes 24, 26 normal to the substrate 22 (as shown in FIG. 2). The electrodes 24, 26 may be uniformly coated on the substrate 22 or patterned (as shown in FIGS. 4-8). Step 76 of the method 70 may include determining a depth of absorption for the substrate 22 based on the semiconductor material and step 78 may include transmitting RF energy to the substrate 22.

Step 80 of the method 70 includes illuminating the substrate 22 based on the depth of absorption to achieve a predetermined amount of electrical conductivity. The light source 32 (as shown in FIG. 1A) is configured to generate excitation wavelengths having energies that are greater than a band gap of the semiconductor material. Step 82 includes using the power supply 28 (as shown in FIGS. 1A-3) to apply a voltage between the electrodes 24, 26 to modulate the RF transmission through the substrate 22.

Using the pure and "perfect crystal" semiconductor material, electrodes that are arranged normal to the semiconductor material, and an applied voltage to generate an electric field across the substrate advantageously enables short lifetime materials to be used as efficient photoconductors as compared with conventional materials in which the natural recombination of generated electron-hole pairs occurs quickly. Providing the physical separation of the electrons and the electron holes enables the substrate to act as a charged capacitor and modulating the electromagnetic energy through the substrate is further advantageous in controlling the recombination and electrical conductivity of the photoconductor.

Large area photoconductors may be suitable using the photoconductor assembly described herein without providing webs or grids of wires to be formed on the substrate as in conventional large-area photoconductors. In exemplary applications, using the photoconductor assembly described herein may result in power modulation that may be up to a modulation that is between 12 and 16 decibels, or have an intensity modulation ratio that is 20:1, such that the resulting power modulation is much greater than in conventional photoconductor assemblies.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (external components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A photoconductor assembly comprising:
   a substrate formed of an undoped and single-crystal semiconductor material that is configured to reflect or absorb electromagnetic energy;
   a plurality of electrodes arranged normal to the substrate;
   a power supply that applies a voltage to the electrodes for modulating the electromagnetic energy through the substrate; and
   a light source that generates excitation wavelengths for illuminating the substrate having energies that are equal to or greater than a band gap energy of the semiconductor material;
   wherein the plurality of electrodes are arranged on opposing sides of the substrate; and
   wherein the power supply is used to electrically bias the substrate and reduce a recombination rate of relevant carriers by increasing radio frequency modulation.

2. The photoconductor assembly according to claim 1, wherein the semiconductor material has a resistivity that is greater than 5000 ohms-cm.

3. The photoconductor assembly according to claim 1, wherein the semiconductor material is float-zone silicon or germanium.

4. The photoconductor assembly according to claim 1 further comprising an insulating layer formed on at least one of two opposing faces of the substrate.

5. The photoconductor assembly according to claim 1, wherein the electrodes are formed of a transparent conductive film.

6. The photoconductor assembly according to claim 5, wherein the transparent conductive film includes indium tin oxide.

7. The photoconductor assembly according to claim 1, wherein the substrate is formed as a disc-shaped wafer.

8. The photoconductor assembly according to claim 1, wherein the electrodes are uniformly coated on opposing surfaces of the substrate.

9. The photoconductor assembly according to claim 1, wherein the electrodes are patterned on the substrate.

10. The photoconductor assembly according to claim 9, wherein the electrodes are arranged in a pattern that includes at least one of striped or checkered.

11. The photoconductor assembly according to claim 1, wherein the power supply is configured to apply a modulated voltage.

12. The photoconductor assembly according to claim 1, wherein the wavelengths have a length in a range that is between zero and ten percent shorter than a wavelength corresponding to the band gap energy of the semiconductor material.

13. The photoconductor assembly according to claim 1, further comprising an electromagnetic energy transmitter operatively coupled to the substrate to transmit energy to the substrate.

14. The photoconductor assembly according to claim 13, wherein the electromagnetic energy transmitter is a microwave transmitter.

15. The photoconductor assembly according to claim 13, wherein the electromagnetic energy transmitter is a radio frequency (RF) transmitter.

16. The photoconductor assembly according to claim 1, further comprising a receiver operatively coupled to the substrate to receive energy from the substrate.

17. The photoconductor assembly according to claim 16, wherein the receiver is a radio frequency (RF) receiver.

18. An electronic device comprising:
an electromagnetic energy transmitter;
a wafer that is formed of an undoped and single-crystal semiconductor material that reflects or absorbs electromagnetic energy from the electromagnetic energy transmitter;
a light source that generates excitation wavelengths for illuminating the wafer having energies that are greater than a band gap of the semiconductor material;
a plurality of electrodes arranged normal to the wafer; and
a power supply that applies a voltage to the electrodes for modulating the electromagnetic energy through the wafer;
wherein the plurality of electrodes are arranged on opposing sides of the wafer; and
wherein the power supply is used to electrically bias the substrate and reduce a recombination rate of relevant carriers by increasing radio frequency modulation.

19. The electronic device according to claim 18, wherein the power supply is configured to apply a modulated voltage and/or the light source includes a pulsed light source or an analog intensity modulator.

20. The electronic device according to claim 18, wherein the semiconductor material is a float-zone silicon or germanium.

21. The electronic device according to claim 18, wherein the wavelengths have a length in a range that is between zero and ten percent shorter than a wavelength corresponding to the band gap energy of the semiconductor material.

22. The electronic device according to claim 18, wherein the electrodes are uniformly coated on opposing sides of the wafer or patterned on at least one of the opposing sides of the wafer.

23. A method of generating electrical conductivity for a photoconductor, the method comprising:
forming a wafer of an undoped and single-crystal semiconductor material for absorbing electromagnetic energy;
arranging a plurality of electrodes normal to the wafer, wherein the plurality of electrodes are arranged on opposing sides of the wafer;
determining a depth of absorption for the wafer;
transmitting electromagnetic energy to the wafer;
illuminating the wafer based on the depth of absorption using a light source that generates excitation wavelengths having energies that are greater than a band gap of the semiconductor material; and
applying a voltage between the electrodes to modulate the electromagnetic energy through the wafer.

* * * * *